US007117413B2

(12) United States Patent
Park et al.

(10) Patent No.: US 7,117,413 B2
(45) Date of Patent: Oct. 3, 2006

(54) WRAPPED CORE LINKING MODULE FOR ACCESSING SYSTEM ON CHIP TEST

(75) Inventors: Chang Won Park, Gyeonggi-do (KR);
Sung Ju Park, Gyeonggi-do (KR);
Hyung Su Lee, Seoul (KR); Jae Hoon Song, Seoul (KR)

(73) Assignee: Korea Electronics Technology Institute, Pyeongtaek-si (KR)

( * ) Notice: Subject to any disclaimer, the term of this patent is extended or adjusted under 35 U.S.C. 154(b) by 327 days.

(21) Appl. No.: 10/284,123

(22) Filed: Oct. 31, 2002

(65) Prior Publication Data
US 2003/0131296 A1    Jul. 10, 2003

(30) Foreign Application Priority Data
Jan. 8, 2002    (KR) .................... 10-2002-0000981

(51) Int. Cl.
*G01R 31/28* (2006.01)
(52) U.S. Cl. .................... 714/727; 714/729; 714/724; 714/718
(58) Field of Classification Search ................ 714/718, 714/702, 720, 724, 727, 734, 729; 716/4; 370/250
See application file for complete search history.

(56) References Cited

U.S. PATENT DOCUMENTS

| | | | |
|---|---|---|---|
| 4,695,997 A * | 9/1987 | Montanari et al. .......... 370/250 |
| 6,324,662 B1 | 11/2001 | Haroun et al. | |
| 6,381,717 B1 | 4/2002 | Bhattacharya | |
| 6,408,413 B1 | 6/2002 | Whetsel | |
| 6,499,125 B1 * | 12/2002 | Ohta et al. ................... 714/734 |
| 6,587,979 B1 * | 7/2003 | Kraus et al. ................ 714/720 |
| 6,629,223 B1 * | 9/2003 | Bachot et al. .............. 711/167 |
| 6,631,504 B1 * | 10/2003 | Dervisoglu et al. ............ 716/4 |
| 6,851,079 B1 * | 2/2005 | Hergott ...................... 714/724 |

OTHER PUBLICATIONS

Benabdenbi, M.; Maroufi, W.; Marzouki, M.;Design, Automation and Test in Europe, 2001. Conference and Exhibition 2001. Proceedings13-16 Mar. 2001 pp. 150-155 Digital Object Identifier 10.1109/DATE.2001.915016 ☐☐.*

* cited by examiner

*Primary Examiner*—Guy Lamarre
*Assistant Examiner*—Fritz Alphonse
(74) *Attorney, Agent, or Firm*—Greenblum & Bernstein, P.L.C.

(57) ABSTRACT

A wrapped core linking module for accessing system on chip test includes a link control register that stores link control configuration between cores in a scan path of a system on chip according to control signals applied from an outside boundary. A link control register controller controls a shift and update link configuration by activating the link control register. A switch switches the scan path between wrapped cores based on the link control configuration of the link control register. An output logic connects the link control register to a test data out (TDO) of the chip in case of testing on chip or cores of system on chip.

2 Claims, 7 Drawing Sheets

WRAPPED CORE LINKING MODULE FOR ACCESSING SYSTEM ON CHIP TEST

BACKGROUND OF THE INVENTION (a) Field of the Invention

The present invention relates generally to wrapped core linking module (WCLM) for accessing system on chip (SoC) test and, more particularly, to WCLM for systematically accessing a SoC test in which not only IEEE 1149.1 boundary scan but also cores embodied by an IEEE P1500 wrapper maintain compatibility with the IEEE 1149.1 standard and have expandability.

(b) Description of the Related Art

In general, there were a plurality of proposed methods using the prior test board of the IEEE 1149.1 standard for testing SoC comprising IP cores, which are shown in FIG. 1 through FIG. 6.

The structure for accessing SoC test serially connected to test data in (TDI) and test data out (TDO) shown in FIG. 1 is serial connection method of all TAPs between TDI and TDO. The structure always has the maximum length of the scan path because all TAPs are activated in case of test mode. In view of chip level, said structure for accessing SoC test violates the IEEE 1149.1 standard due to the all activated TAPs.

The structure for accessing SoC test with dedicated selection pins shown in FIG. 2 is a method of adding the selection pins, which each pin selects TAP. Due to select TAP1 in the SoC test and one of TAP2 through TAP4 in case of core test, the number of the selection pins increases in proportion to the increasing number of TAP. However, said structure for accessing SoC test with the dedicated selection pins has a problem unable to select a group of TAP.

Also, the processor core with an IEEE 1149.1 and a debugging register shown in FIG. 3 as the method proposed by IBM uses to debug processor core embedding the debugging register.

That is, the method places the processor cores serially connected to the TAPs using an IEEE 1149.1 in SoC and processor core on the scan path in case of test mode so that it is able to access to the debugging register in the processor cores (P1~P3) The method has a problem disable to check linking line between the processor cores and the boundary scan register, ICBSR, because there is only one test data register between TDI and TDO.

In addition, the structure for accessing SoC test with TLM shown in FIG. 4 as the method proposed by TI is able to dynamically connect all TAPs using TAP linking module. The operation as the default to make TAP1 such as SoC TAP activated places TAP1 on the scan path of TDI and TDO. Thus, it satisfies the IEEE 1149.1 standard in chip level.

If said structure for accessing SoC test with TLM inactivates TAP1 and TAP4 and activates TAP2 and TAP3 for testing core and places them on the scan path of TDI and TDO, it inserts a link_update instruction to the activated TAP1 and SEL signal from TAP1 is applied to TLM in order that TLM updates link configuration. Then the link configuration of TLM is updated by TDI and TMS input.

If the link configuration is updated, enabled ENA (ENA='1') from the TLM applied to TAPs (TAP2 and TAP3) to activate and disabled ENA (ENA='0') from the TLM applied to TAPs (TAP1 and TAP4) to inactivate. TAP2 and TAP3 are placed on the scan path of TDI and TDO so that the linking line between cores can be checked.

At this point, TAP1 and TAP4 excluded in the scan path of TDI and TDO keep the stable RunTest/Idle state. Due to adding SEL and ENA signals and the link_update instruction to each standard TAPs, the architecture of the provided IP and the standard TAP needs to change.

The structure for accessing SoC test with modified TLM shown in FIG. 5 as a method proposed by TI to solve TLM's problem is not necessary to change the architecture of IP core, which is the principle problem of the TLM method proposed by TI. Therefore, the structure for accessing SoC test with modified TLM is able to use the provided IP core and enables the dynamically various links of cores with TAPs.

To obtain this, a module called a state condition expander (SCE) was added in each TAP. The operation of the module as a default activates TAP1 such as SoC TAP and places the TAP1 on the scan path of TDI and TDO. Thus, the operation satisfies the IEEE 1149.1 standard in chip level.

If said structure for accessing SoC test with modified TLM inactivates TAP1 & TAP4 and activates TAP2 & TAP3 for testing cores placed on the scan path of TDI-TDO and applies SEL_TLM='1' of SoC, said TLM is placed on the scan path of TDI-TDO in SoC and then the link configuration of TLM is updated by TDI and TMS inputs.

At this point, all TAPs are on the stable RunTest/Idle state. After updating the link configuration, the activated TAP2 and TAP3 are synchronized with a test bus of SoC and have state transition. TAP1 and TAP4 excluded on the scan path of TDI-TDO keep the stable Run Time/Idle state. If the method is hierarchically used as allocating of additional pins to SoC, the number of pins increases in proportion to the additional pins.

The method of hierarchical TAP (HTAP) shown in FIG. 6 is another method proposed by TI. The HTAP comprises mainly a programmable switch and Snoopy-TAP (SN-TAP).

Said programmable switch provides dynamically various links to TAPs of each core and plays a role of placing on the path of TDI-TDO in SoC. That is, as the compatible 1149.1 TAP of SoC, said programmable switch operates by the 1149.1 standard TAP on a board in chip test. In case of testing core in SoC, said programmable switch plays a role of an intermediary in order that cores of each TAP use a test bus of the SoC.

Said HTAP method solves defects of both the prior TLM method and an ad-hoc method. Because an additional TAP controller of said HTAP method is not necessary for a module to update link configuration between cores as that of a TLM method needed, the power and area overhead of said HTAP method decreases. Said HTAP method changes the mode bit of a control register in SN-TAP as '1' so that the SN-TAP such as SoC TAP enters into the Snoopy state for core test. Thus, said HTAP method enables TMS (TMS='0') when the down edge of TCK in said HTAP method is on the Update-DR state.

Said SN-TAP enters not into the RunTest/Idle state of the 1149.1 standard but into the SN-TL-Reset state, which uses separate state transition besides the state transition of the IEEE 1149.1 standard TAP controller. Thus, the state transition is unnatural in view of state transition of the IEEE 1149.1 standard TAP. Also, It requires for a test engineer to have a clear knowledge about additional operations besides the IEEE 1149.1 standard operation. However, the HTAP method is required to change an 1149.1 standard TAP controller of SoC and it is necessary to have an additional register to control. Also, there was a problem unable to check a linking line between ICBSR and CBSR.

SUMMARY OF THE INVENTION

Therefore, it is an object of the present invention to provide architecture of wrapped core linking module (WCLM) for accessing system on chip (SoC) test with a solution of said problems.

It is another object of the present invention to provide an architecture of WCLM for accessing SoC test in which not only an IEEE 1149.1 boundary scan but also cores embodied by an IEEE P1500 wrapper maintain compatibility with the IEEE 1149.1 standard and have expandability.

In accordance with one aspect of the present invention, the architecture of WCLM for accessing SoC test includes a link control register for storing link control configuration between cores in the scan path of SoC according to control signals applied from the outside boundary, a link control register controller for controlling to shift and update link configuration by activating said link control register, a switch for setting the scan path between wrapped cores based on the link control configuration of said link control register and an output logic for connecting said link control register to TDO of the chip in case of testing SoC or cores of SoC.

DETAILED DESCRIPTION OF THE PREFERRED EMBODIMENTS

Referring to the below attached figures, the following proper embodiment examples of the present invention will be fully illustrated.

In the following, the present invention makes dynamically various links of IP cores in SoC comprising both an IEEE 1149.1 wrapper and an IEEE P1500 wrapper. As proper embodiment examples of the present invention, the WCLM for accessing SoC test, a test controller for SoC test, will be illustrated. But the technical idea of the present invention is neither limited nor restricted by the given illustration. Manufactures can modify the present invention. Also, the modified invention can be executed variously.

Referring to FIG. 7 through FIG. 13, the following illustrates WCLM for accessing SoC test in accordance with the present invention.

Figure 1:
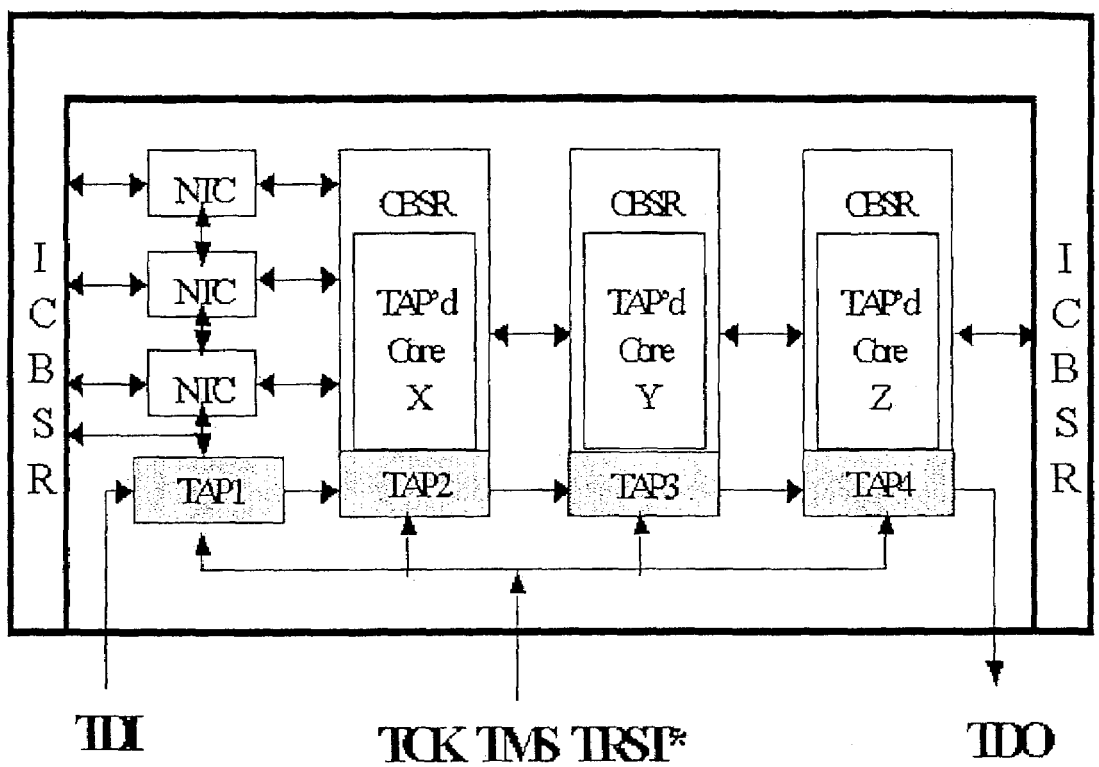
FIG. 1 is a schematic diagram illustrating a structure for accessing SoC test serially connected with TDI and TDO.
Figure 2:
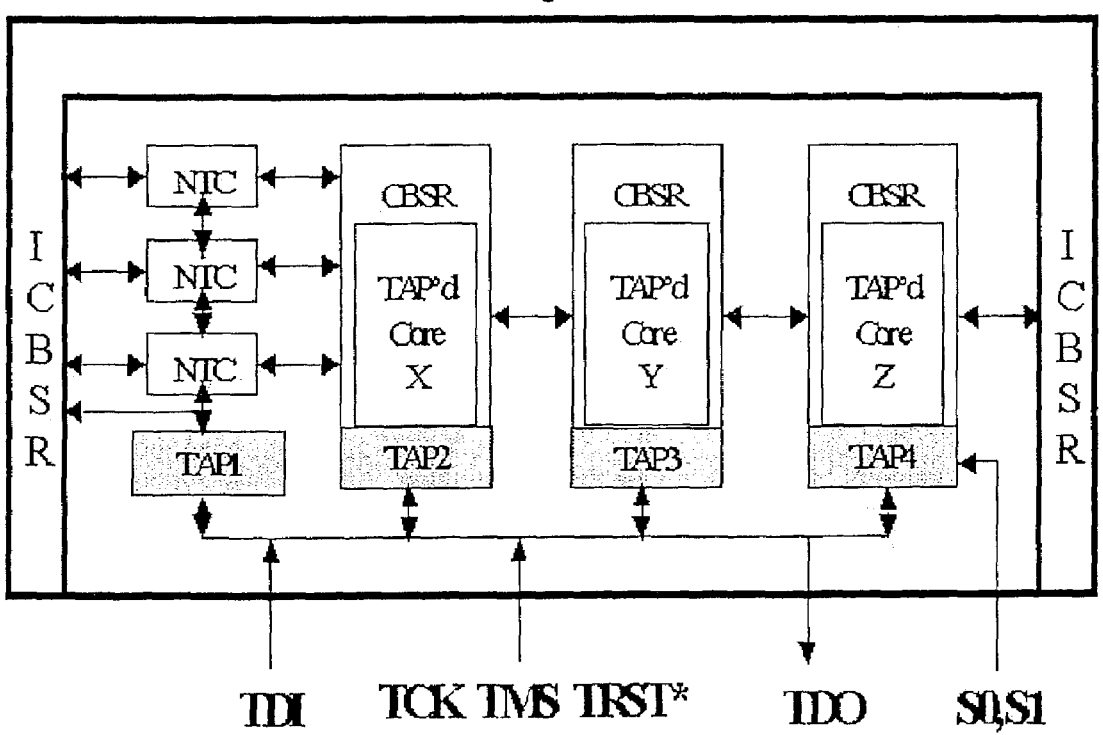
FIG. 2 is a schematic diagram illustrating a structure for accessing SoC test with dedicated selection pins.
Figure 3:
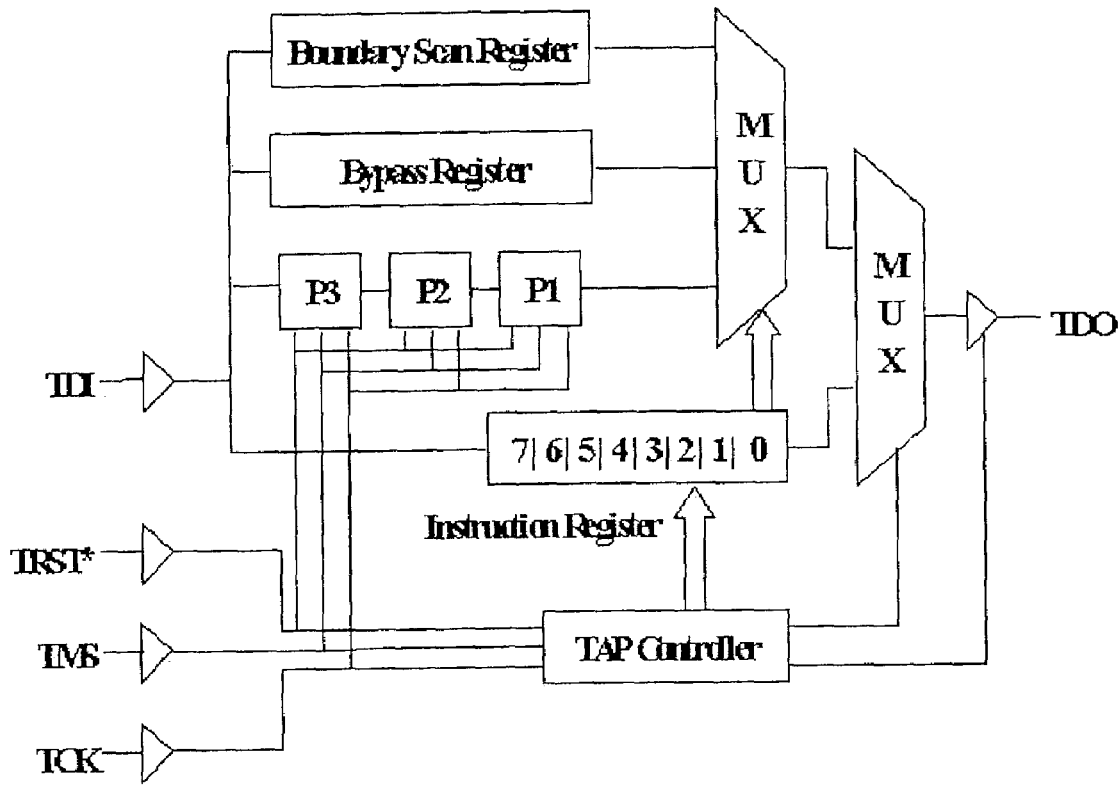
FIG. 3 is a diagram illustrating a processor core with an IEEE 1149.1 and a debugging register.
Figure 4:
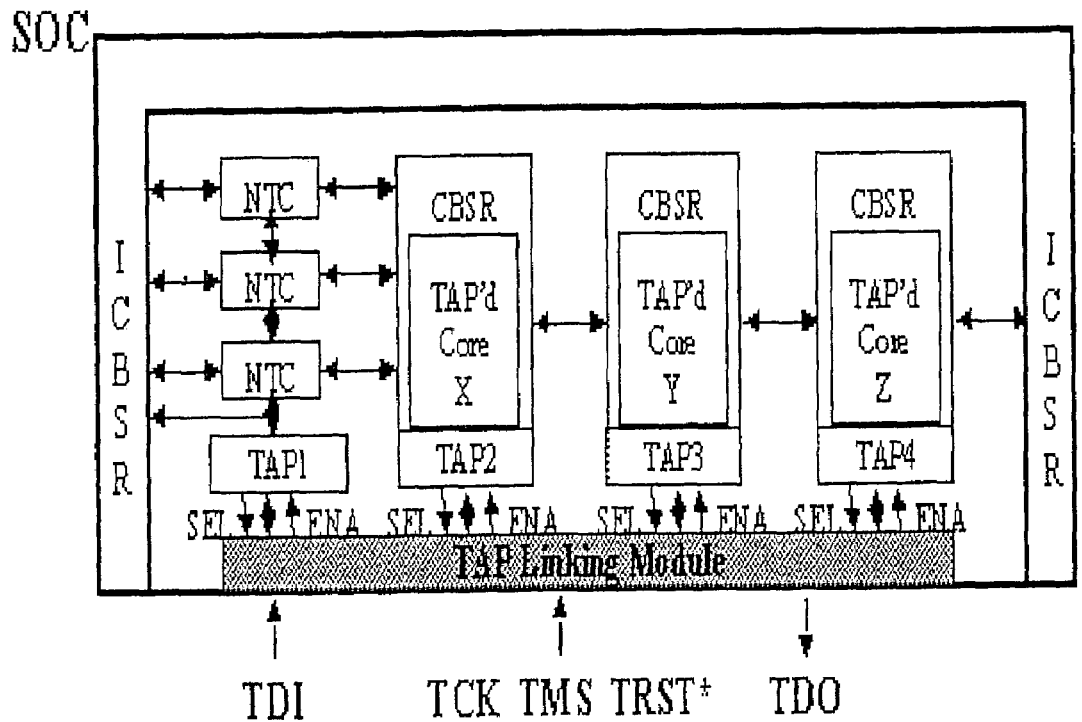
FIG. 4 is a schematic diagram illustrating a structure for accessing SoC test with TLM.
Figure 5:
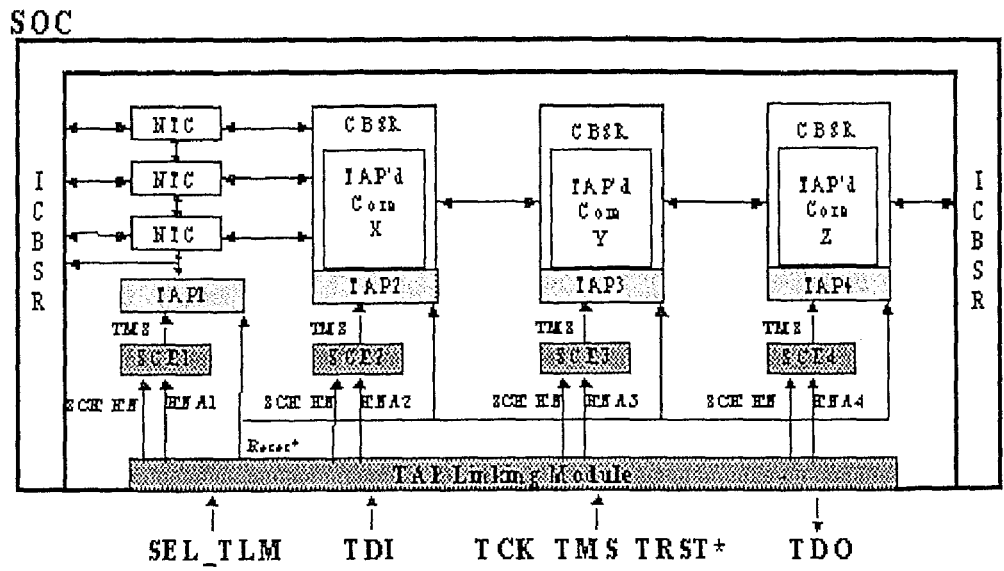
FIG. 5 is a schematic diagram illustrating a structure for accessing SoC test with modified TLM.
Figure 6:
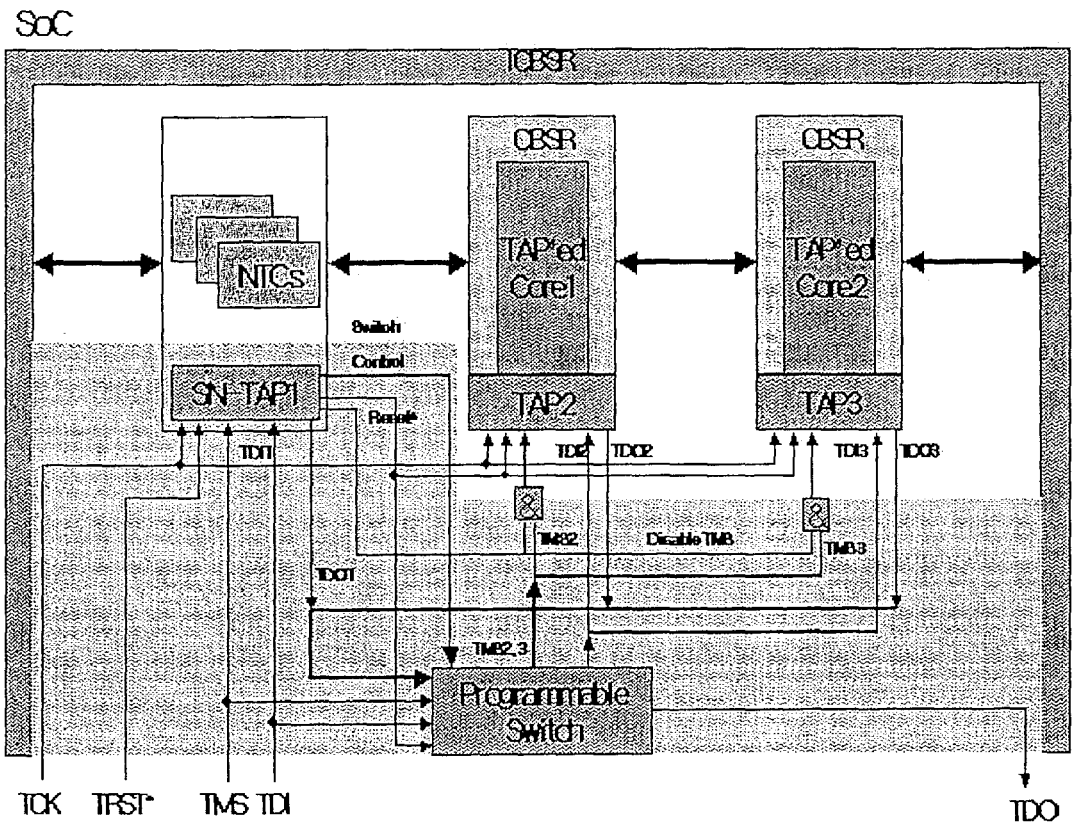
FIG. 6 illustrates a hierarchical TAP scheme.
Figure 7:
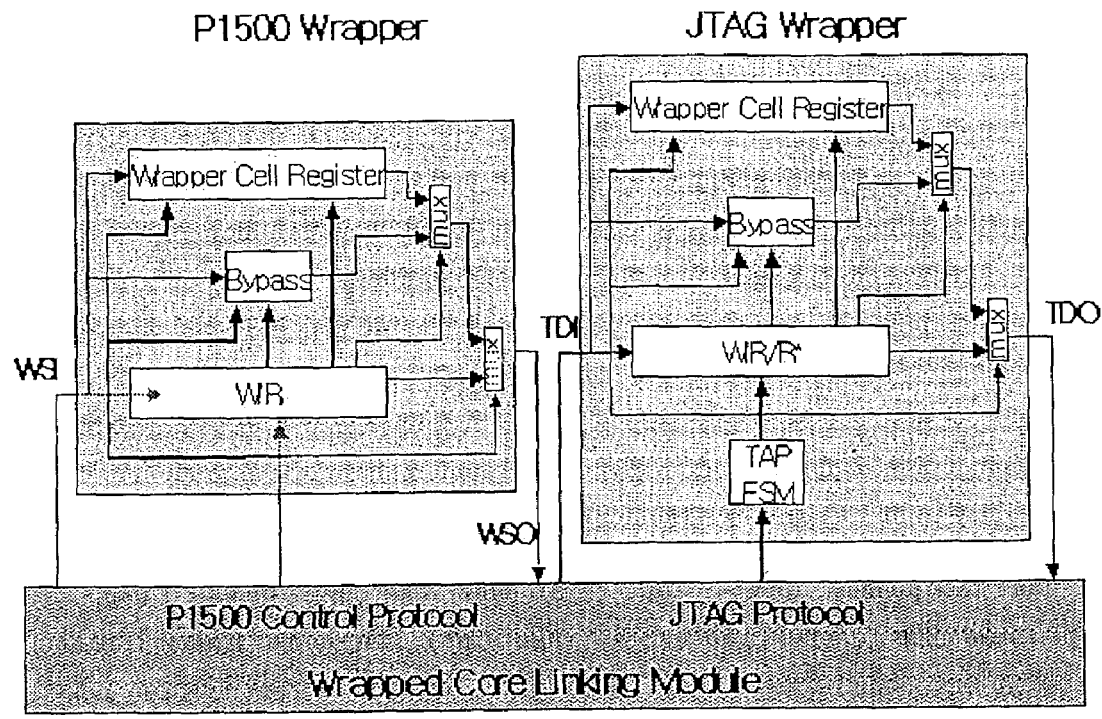
FIG. 7 is a schematic diagram illustrating WCLM as a test controller under the core environment having an IEEE P1500 wrapper and an IEEE 1149.1 JTAG wrapper.
Figure 8:
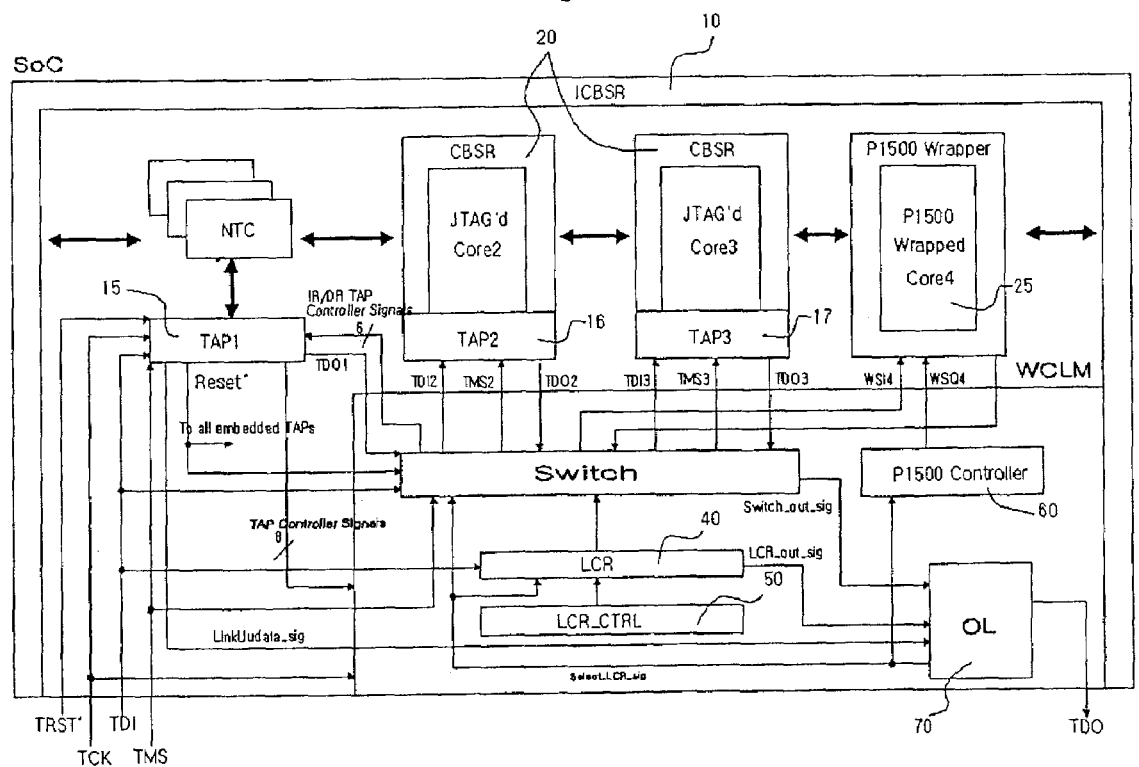
FIG. 8 is a schematic diagram illustrating a basic structure of WCLM for accessing SoC test in accordance with the present invention.
Figure 9:
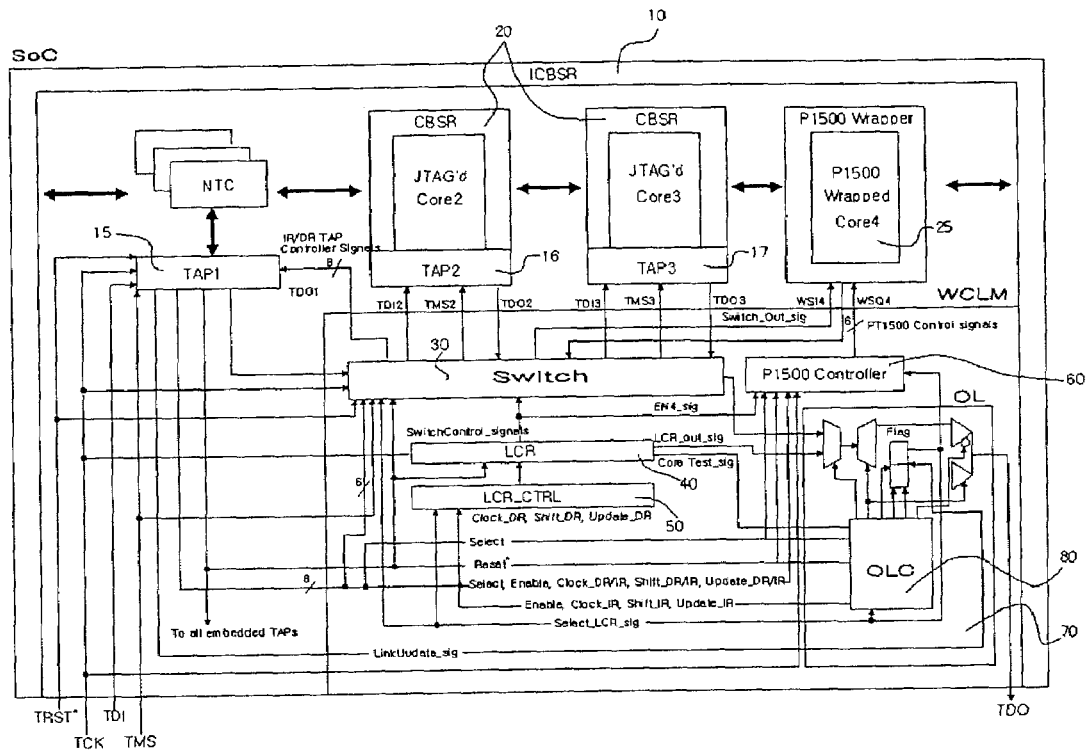
FIG. 9 is a schematic diagram illustrating a detailed structure of WCLM for accessing SoC test in accordance with the present invention.
Figure 10:
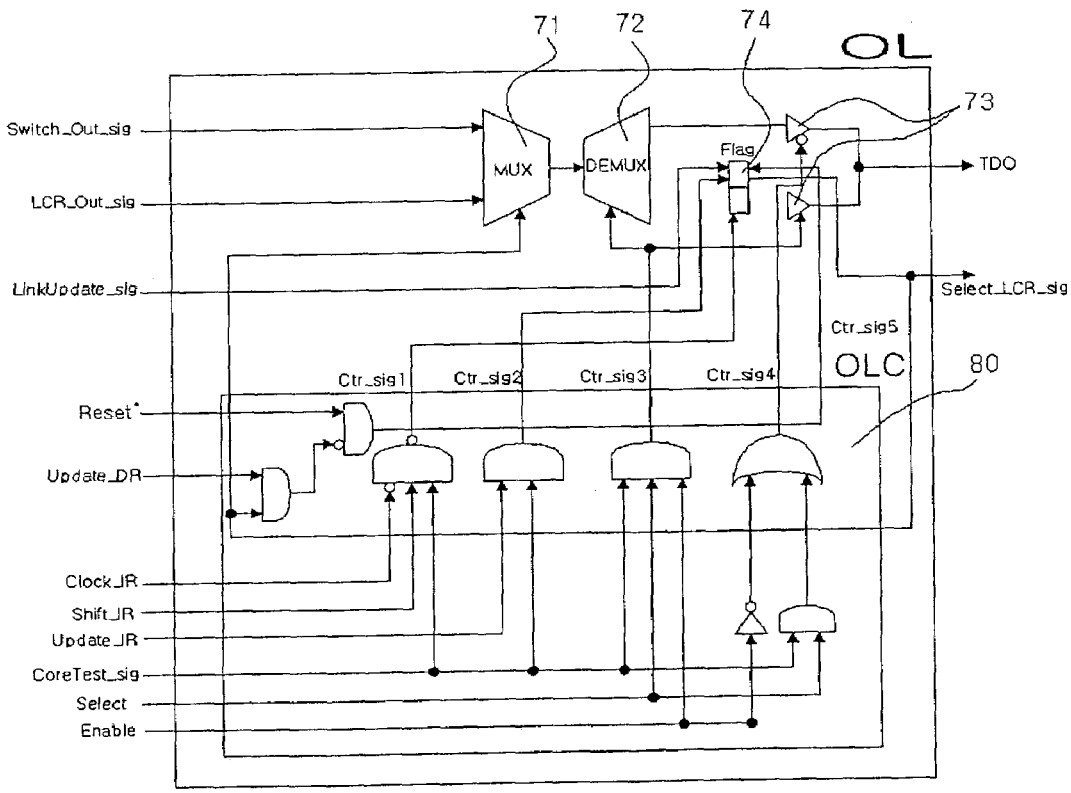
FIG. 10 illustrates an OL structure.
Figure 11:
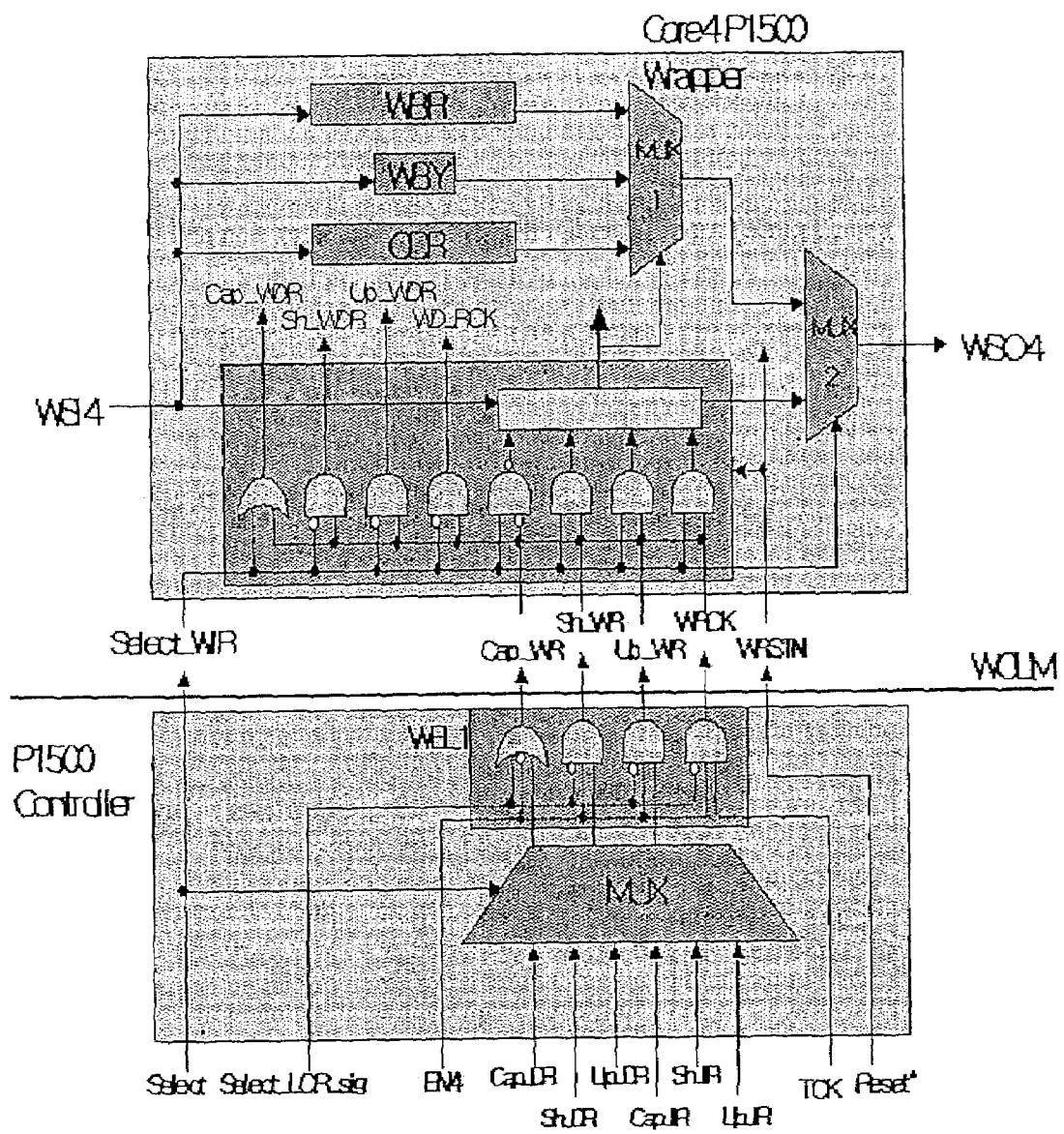
FIG. 11 is a schematic diagram illustrating a gearing structure of cores with an IEEE P1500 controller and an IEEE P1500 wrapper of WCLM.
Figure 12:
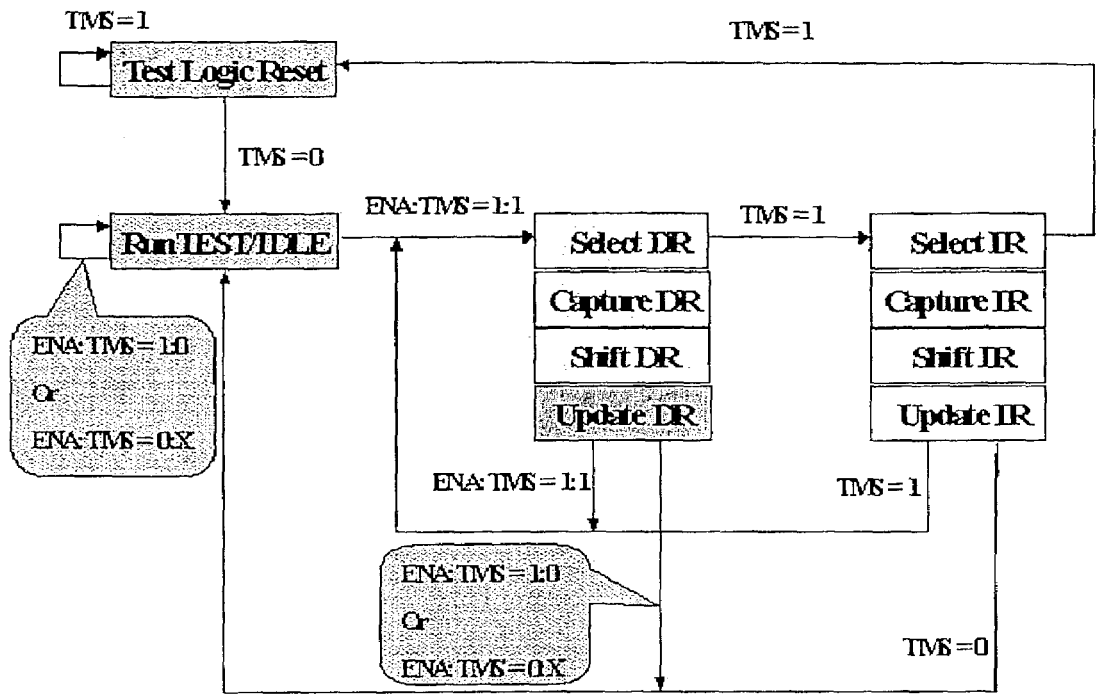
FIG. 12 is a diagram for illustrating state transition of a wrapper by WCLM in accordance with the present invention.
Figure 13:
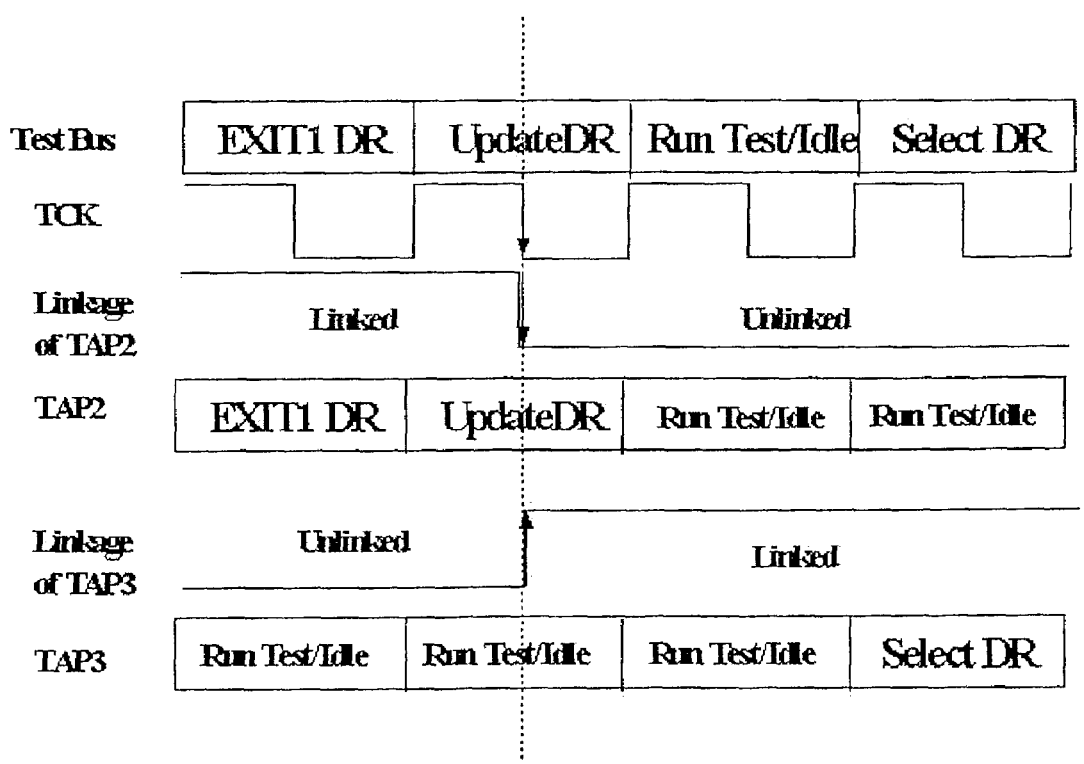
FIG. 13 shows a timing diagram of link configuration by WCLM.

FIG. 7 is a diagram for illustrating WCLM as a test controller under the core environment having an IEEE P1500 wrapper and an IEEE 1149.1 JTAG wrapper. FIG. 8 is a diagram for illustrating a basic structure of WCLM for accessing SoC test in accordance with the present invention. FIG. 9 is a diagram for illustrating a detailed structure of WCLM for accessing SoC test in accordance with the present invention. FIG. 10 is a diagram for illustrating an OL structure. FIG. 11 is a diagram for illustrating a gearing structure of cores with an IEEE P1500 controller and an IEEE P1500 wrapper of WCLM. FIG. 12 is a diagram for illustrating state transition of a wrapper by WCLM in accordance with the present invention. FIG. 13 shows a timing diagram of link configuration by WCLM.

The architecture of WCLM for accessing SoC test includes a link control register (LCR) for storing link control configuration between cores in the scan path of SoC according to control signals applied from the outside boundary, a link control register controller (LCR_CTRL) for controlling to shift and update link configuration by activating said link control register, a switch (Switch) for setting the scan path between wrapped cores based on the link control configuration of said link control register, and an output logic (OL) for connecting said link control register to TDO of the chip in case of testing SoC or cores of SoC.

Referring to FIG. 7, there is illustrated WCLM as a test controller under the core environment with an IEEE P1500 wrapper and an IEEE 1149.1 JTAP wrapper. WCLM 5 operates to control not only IEEE P1500 protocol but also IEEE 1149.1 protocol shown in FIG. 7, which enables the various links to an P1500 wrapper 1 and an JTAP wrapper 2 using said WCLM 5.

As the IEEE 1149.1 standard supported by said WCLM 5 for testing a chip on a board, said WCLM 5 operates to check linking lines between chips on a board.

The core test standard such as an IEEE P1500 was proposed for testing IP cores rather than a chip. If the chip implemented by an IEEE 1149.1 becomes a core, then we call the core implemented by the IEEE 1149.1 or the IEEE P1500 a wrapped core. That is, the wrapped core means what is wrapped as circuit.

In case of a plurality of cores with those wrappers on SoC, said WCLM 5 selects individual wrapped core or a plurality of wrapped cores simultaneously and is able to variously generate the scan path for test.

Referring to FIG. 8, there is illustrated a basic structure of WCLM. ICBSR 10 is a boundary scan register of SoC and TAP1 15 is IEEE 1149.1 TAP of SoC. The TAP1 15 as chip TAP operates in case of testing on a board or plays a role of applying control signals to WCLM in case of testing cores. That is, the basic structure of WCLM using a controller of the prior chip TAP enables the power and area overhead to decrease.

TAP2 16 and TAP3 17 are respectively IEEE 1149.1 TAPs about the core2 and the core3 with IEEE 1149.1 JTAG. CBSR 20 is a boundary scan register of the cores.

The IEEE P1500 controller in WCLM controls the core4 25 wrapped by an IEEE P1500 wrapper.

Said WCLM 5 comprises Switch 30, LCR 40, LCR_CTRL 50, P1500 controller 60 and OL.

The main signal includes all TAP1 control signals applied to WCLM from test reset (TRST*), test clock (TCK), TDI, test mode sequence (TMS), TDO and TAP1 of SoC (i.e. Reset*, Select, Enable, Clock_DR, Shift_DR, Update_DR, Clock_IR, Shift_IR and Update_IR), TAP1 control signals gated and applied to TAP1 15 by Switch 30 (i.e., Clock_DR, Shift_DR, Update_DR, Clock_IR, Shift_IR and Update_IR) and LinkUpdate_sig signal from a TAP1 instruction register.

TCK signal of said SoC is directly connected to TAP1 15 and respectively both TAP2 16 and TAP3 17 and is applied to WCLM. TDI pin signal is directly connected to TAP1 15, LCR 40 of WCLM and Switch 30. TMS pin signal is connected to TAP1 15 and Switch 30. TMS pin signal gated by Switch 30 is applied to each TAP2 16 and TAP3 17 as TMS 2 and TMS3.

Referring to FIG. 9, there is illustrated a detailed structure of WCLM. Said WCLM 5 connects Reset*, Select, Clock_DR, Shift_DR, Update_DR, Clock_IR, Shift_IR and Update_IR signals among 9 signals of the TAP1 15 controller to the IEEE P1500 controller 60, applies Clock_DR, Shift_DR and Update_DR signals as an input to LCT_CTRL 50 controlling LCR 40, and applies Reset*, Select, Enable, Clock_IR, Shift_IR, Update_IR and Update_DR signals to OL 70.

Select signal, which determines whether state of TAP1 15 controller is either DR-Scan or IR-Scan, is applied to the IEEE P1500 controller 60 and the OLC 80 of OL 70. Reset* signal is applied to the flag register 74 of Switch 30, LCR 40 and OL 70.

Also, Enable signal as input is connected to OLC 80 of OL 70 when a test bus state is either ShiftIR or ShiftDR for outputting the result to TDO. The following is the function and structure of each module.

Said Switch includes a crossbar switch for setting the scan path, a circuit to make TMS pin signal of SoC gate on/off, a circuit to apply signals of a SoC TAP controller for gating on/off to Soc TAP and a circuit to reset TAP of IP core without a TRST* pin.

Input of said Switch 30 receives link configuration of Reset*, Clock_DR, Shift_DR, Update_DR, Clock_IR, Shift_IR, Update_IR signals and LCR 50 as control signal of said Switch 30 from TDI and TMS pin signals of SoC, each cores of IEEE 1149.1 TAP TDO signal, IEEE P1500 wrapper serial output (WSO) signal and SoC TAP.

That is, the signal from LCR 40 controls a circuit gating on/off signals of a crossbar switch in the Switch 30, TMS of SoC, and a SoC TAP controller.

Said Switch 30 output includes signals applied to each TAPs of TDI and wrapper serial input (WSI) of IEEE P1500 wrapper, signals of a SoC TAP controller gated on/off and Switch_out_sig applied to OL 70.

Said Switch_out_sig is either TAP TDO signal or signals between WSO signals of IEEE P1500 wrapper for outputting a test vector of core in the end of the TDI-TDO scan path in SoC.

Said Switch 30 sets the practical scan path between wrapped cores based upon link configuration of LCR 40.

Also, said Switch 30 sets a test mode sequence (TMS) gate as '0' for cores of IEEE 1149.1 TAP excluded from the scan path and keeps remaining the cores as the RunTest/Idle state until returning the cores onto the scan path.

Said Switch 30 resets the TMS gate as '1' for wrapped core without a TRST port during a certain number of clocks (i.e., five clock times) in case of resetting a chip level of SoC.

The following illustrates more specific functions of said Switch 30. Said Switch 30 has global reset function and forcedly applies five times enabling TMS (TMS='1') to TAP of each IP core for resetting TAP of IP core without a TRST* port in case of applying either five times enabling TMS (TMS='1') or disabling TRST* (TRST*='0') to SoC TAP. Thus, said Switch 30 places only SoC TAP in the scan path of TDI-TDO in SoC.

Also, said Switch 30 has configuration of the scan path and sets the scan path of cores between TDI and TDO of SoC based upon information of LCR 40 having link configuration of cores with an IEEE 1149.1 JTAG wrapper or an IEEE P1500 wrapper. Said Switch gates off TMS (TMS='0') for TAP of core having an IEEE 1149.1 wrapper excluded from scan path so that said Switch 30 can be the stable state of the RunTest/Idle. If SoC TAP is excluded from the scan path, said Switch 30 keeps remaining the current state of a test data register and an instruction register of SoC to make control signal of a SoC TAP controller gated off.

TAP in the scan path applies TMS signal of SoC to Said Switch 30 so that the said Switch 30 is synchronously linked to the test bus of SoC.

An IEEE P1500 controller 60 controls cores with an IEEE P1500 wrapper excluded from the scan path in order to be the stable state. In case of LCR 40 located in the scan path of TDI-TDO for changing link configuration of cores, said Switch 30 keeps remaining the current state of a test data register and an instruction register of SoC to make control signal of a SoC TAP controller gated-off. Said Switch 30 gates off TMS (TMS='0') applied to TAP of all IP cores and makes transition from the finite state to the RunTest/Idle state, which is made by Select_LCR_sig. At this time, an IEEE P1500 wrapper by an IEEE P1500 controller 60 also keeps the current state.

Said LCR 40 is a register for storing information about link control how to link wrapped cores.

Said LCR 40 uses for updating and maintaining link configuration between both cores with IEEE 1149.1 TAP and cores with an IEEE P1500 wrapper in the scan path of TDI-TDO in SoC and is controlled by LCR_CTRL 50.

That is, said LCR 40 has information about which core is excluded or included in the scan path of TDI-TDO in case of test mode.

Said LCR 40 includes a shift register used in case of updating link configuration and an update register maintaining the updated link configuration.

The shift register of said LCR 40 in case of updating link configuration is located in the scan path of TDI-TDO in SoC and is updated in case of Scan-DR of test bus.

Input signal of said LCR 40 is applied to data input of a shift register from TDI pin signal of SoC and signals from Reset* and LCR_CTRL 50 of TAP1 is applied to control LCR.

If Reset* is disabled (Reset*='0') and reset, said LCR 40 sets link configuration placing only SoC TAP on the scan path of TDI-TDO in SoC.

Output signal of said LCR 40 used for controlling Switch 30 comprises signals corresponding to link configuration of an updating register, LCR_out_sig connected to multiplex (MUX) 71 in OL 70 and CoreTest_sig used for controlling OL 70.

Said LCR_out_sig is shift register output of LCR 40. Said CoreTest_sig becomes 1 if IP core with a wrapper has more than at least one activated core and 0 if only SoC TAP is activated.

Said LCR_CTRL 50 is a controller for controlling LCR 40.

When Select_LCR_sig is '1' and the test bus is Scan_DR, said LCR_CTRL 50 activates LCR 40 and controls to shift and update link configuration.

Said Select_LCR_sig as signal for determining to update link configuration of cores gates on/off CLOCK_DR, SHIFT_DR and UPDATE_DR signals of the TAP1 15 controller applies those signals to LCR 40.

Said OL 70 is a circuit controlling output.

Referring to FIG. 10 to illustrate a structure of OL 70, said OL 70 connects Switch_out_sig to SoC TDO when testing SoC of a chip level on a board or core in SoC. When updating link configuration of cores, said OL 70 connects LCR_out_sig to TDO.

Said OL 70 comprises MUX 71, DEMUX 72 and two tri-state buffers 73 to connect Switch_out_sig or LCR_out_sig to TDO, OLC 80 to control those and a flag register 74 instructing updating link configurations of cores.

If said flag register 74 is IR-Scan in core test mode, it is placed at the end on the TDI-TDO scan path of instruction registers. If said flag register 74 is '1' (Select_LCR_sig='1'), it places LCR 40 on the scan path of TDI-TDO and is able to update link configuration of cores.

When Reset* or the current flag register is '1' and Update_DR enables (Update_DR='1'), the flag register is reset to '0'. According to CoreTest_sig, core test mode is determined.

If tri-state buffer 73 instead of MUX 71 at the end of output is used, delays by a gate level were decreased.

Clock_IR, Shift_IR, Update_IR, Update_DR, Reset*, Enable and Select among output signals of a TAP1 15 controller, SoC TAP, are input as control signal of OL 70. Clock_IR, Shift_IR and Update_IR signals are used for shifting and updating test vector to the flag register when CoreTest_sig is '1' (CoreTest_sig='1') and the test bus is Scan-IR.

According to Select signal, Scan-IR of said test bus is determined. Enable signal is control signal for outputting HighZ (high impedance) to TDO when test bus state is neither ShiftIR nor ShiftDR. That is, Enable is '1' (Enable='1') when the test bus is either ShiftIR or ShiftDR.

Now, FIG. 11 shows a gearing structure with a core with an IEEE 1500 controller and an IEEE P1500 wrapper of WCLM. Referring to FIG. 11, the IEEE P1500 controller 60 is illustrated. The IEEE P1500 controller 60 is able to decrease the power and area overhead as using signal from the prior IEEE 1149.1 TAP controller of SoC.

Said IEEE P1500 controller 60 comprises wrapper enable logics (WEL) 62 as many as the number of cores with both one MUX 61 and one IEEE P1500 wrapper.

If Select is '0' (Select='0'), said MUX 61 connects Cap_DR, Sh_DR and Up_DR signals to Cap_WR, Sh_WR and Up_WR respectively. If Select is '1' (Select='1'), said MUX 61 connects Cap_IR, Sh_IR and Up_IR signals to Cap_WR, Sh_WR and Up_WR respectively.

Select_LCR_sig and EN4 signals are used for gating on/off Cap_WR, Sh_WR and Up_WR output signals of the IEEE P1500 controller 60. EN4 signal is applied from LCR 40 having link configuration of cores.

In case of SoC comprising cores with an IEEE 1149.1 wrapper, said IEEE P1500 controller 60 makes the power and area overhead optimize according to application environment if there is none of core with the P1500 wrapper.

Now, operation and timing of WCLM are illustrated. If the power is on or reset signal is applied, the first bit of LCR 40 is '1' and the other bits are all '0'. According to that, said WCLM 5 places only SoC TAP on the scan path of TDI-TDO and makes the others such as excluded TAP and P1500 wrappers be in RunTest/Idle state.

Although SoC TAP is inactivated in link configuration of LCR 40, only a test register and an instruction register such as a boundary scan register and a bypass register are excluded from the scan path of TDI-TDO. Thus, a controller of TAP is activated for controlling WCLM.

The principle signal setting upon link configuration of cores in WCLM is LinkUpdate_sig coming from an instruction register of SoC TAP by CoreLinkUpdate instruction and Select_LCR_sig coming from the flag register 71 in OL 70 of WCLM.

LCR 40 by Select_LCR_sig is placed on TDI-TDO. When a data bus is Shift_DR, link configuration of core is applied to LCR 40 through TDI and then LCR 40 changes the updated link configuration in case of TCK down edge of Update_DR.

At this time, LCR 40 is excluded from the TDI-TDO path of SoC as a flag register of OL 70 is reset as '0' (Select_LCR_sig='0').

Updating the LCR 40 as new link configuration, Switch 30 places cores with an IEEE 1149.1 wrapper or an IEEE P1500 wrapper in the TDI-TDO path of SoC. Inactivated TAP makes the TMS gate-off and an IEEE P1500 wrapper keeps maintaining the current state by wrapper enable logic of an IEEE P1500 controller 60.

TAP in the RunTest/Idle state or an IEEE P1500 wrapper maintaining the current state updates link configuration of LCR 40 again and then keeps maintaining the RunTest/Idle state and the current state until it places on the TDI-TDO path of SoC.

All TAPs or an IEEE P1500 wrapper is synchronously linked with a test bus of SoC and then is in the same state.

Referring to FIG. 12 illustrating the state transition of a wrapper by WCLM, inactivated wrapper places in the RunTest/Idle state by the signal (ENA='0') in Switch 30 regardless of TMS in Update state and RunTest/Idle state.

Core with a wrapper is able to do BIST operation as background in Run Test/Idle.

Referring to FIG. 13 illustrating a timing diagram of link configuration update by WCLM, activated TAP2 16 in the scan path of TDI-TDO in SoC by WCLM is inactivated and then is excluded in the scan path. Inactivated TAP3 17 is activated and then is included in the scan path.

When UpdateDR is down edge of TCK, the link configuration is updated. Then inactivated TAP2 16 is placed in the RunTest/Idle state regardless of the test bus state. Inactivated TAP3 17 is activated and is synchronously linked with the test bus. Thus TAP3 17 is in the same transition state with the test bus.

As dynamically various connections with IP cores of SoC, the present invention is able to respectively test IP core and check a linking line between IP cores or to test SoC on a board.

Although exemplary embodiments of the present invention are described above, this description does not limit the scope of the invention, which can be practiced in a variety of embodiments.

As the invention has been described with reference to a specific preferred embodiment thereof, the present invention can respectively test IP core and check a linking line between IP cores or to test SoC on a board as dynamically various connections with IP cores of a SoC comprising IP cores with not only an IEEE 1149.1 wrapper but also an IEEE P1500 wrapper. Thus, the present invention provides effective test environment.

In rapidly increasing degree of architecture integration, the present invention provides an effect to raise production yield rate in order to gain test time reduction and high defect detection rate through an effective test controller of the IP core environment.

What is claimed is:

1. A wrapped core linking module for accessing a system on chip test, comprising:
    a link control register that stores a link control configuration between cores in a scan path of the system on chip according to control signals applied from an outside boundary;
    a link control register controller that controls a shift and update link configuration by activating said link control register;
    a switch that switches the scan path between wrapped cores based on the link control configuration of said link control register; and
    an output logic that connects said link control register to a test data out (TDO) of a chip in case of testing on chip or cores of system on chip, the output logic comprising a flag register configured to load a flag bit,
    wherein said switch sets a test mode sequence (TMS) gate as "0" for controlled cores in scan path and maintains controlled cores as a RunTest/Idle state until returning the controlled cores onto the scan path, and the wrapped core linking module is configured to allow testing interconnections among system on chip and internal core boundaries.

2. The wrapped core linking module of claim 1, wherein for a wrapped core without a test reset (TRST) port, said switch resets the TMS gates as "1" during a certain number of clocks when a chip level of the system on chip is reset.

* * * * *